(12) United States Patent
Sandow et al.

(10) Patent No.: US 11,444,158 B2
(45) Date of Patent: Sep. 13, 2022

(54) SEMICONDUCTOR DEVICE INCLUDING AN ANODE CONTACT REGION HAVING A VARIED DOPING CONCENTRATION

(71) Applicant: Infineon Technologies Austria AG, Villach (AT)

(72) Inventors: Christian Philipp Sandow, Haar (DE); Wolfgang Roesner, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/106,413

(22) Filed: Nov. 30, 2020

(65) Prior Publication Data
US 2021/0175329 A1    Jun. 10, 2021

(30) Foreign Application Priority Data

Dec. 4, 2019   (DE) .......................... 102019133030.0

(51) Int. Cl.
| | | |
|---|---|---|
| *H01L 29/08* | (2006.01) | |
| *H01L 29/739* | (2006.01) | |
| *H01L 29/66* | (2006.01) | |
| *H01L 21/266* | (2006.01) | |
| *H01L 29/40* | (2006.01) | |

(52) U.S. Cl.
CPC ...... *H01L 29/0834* (2013.01); *H01L 29/0847* (2013.01); *H01L 29/66348* (2013.01); *H01L 29/7397* (2013.01); *H01L 21/266* (2013.01); *H01L 29/404* (2013.01); *H01L 29/407* (2013.01)

(58) Field of Classification Search
CPC ............. H01L 29/0834; H01L 29/0847; H01L 29/66348; H01L 29/7397; H01L 21/266; H01L 29/404; H01L 29/407; H01L 29/0623; H01L 29/1095; H01L 21/2652; H01L 27/0629; H01L 21/8249; H01L 29/401; H01L 29/417; H01L 29/66136; H01L 29/7398; H01L 29/8613
USPC .......................................................... 257/140
See application file for complete search history.

(56) References Cited

U.S. PATENT DOCUMENTS

| | | | |
|---|---|---|---|
| 9,105,679 B2 * | 8/2015 | Laven | ................... H01L 29/407 |
| 9,337,270 B2 * | 5/2016 | Pfirsch | ................ H01L 29/7397 |
| 9,543,421 B2 * | 1/2017 | Hikasa | .................. H01L 29/407 |

(Continued)

FOREIGN PATENT DOCUMENTS

DE    102014119 278 A1    6/2015

*Primary Examiner* — Mohammad M Hoque
(74) *Attorney, Agent, or Firm* — Murphy, Bilak & Homiller, PLLC

(57) ABSTRACT

A semiconductor device is proposed. The semiconductor device includes an IGBT in an IGBT portion of a semiconductor body and a diode in a diode portion of the semiconductor body. The diode includes an anode region of a first conductivity type and confined by diode trenches along a first lateral direction. Each of the diode trenches includes a diode trench electrode and a diode trench dielectric. A first contact groove extends into the anode region along a vertical direction from the first surface of the semiconductor body. An anode contact region of the first conductivity type adjoins a bottom side of the first contact groove. A cathode contact region of a second conductivity type adjoins a second surface of the semiconductor body opposite to the first surface. Methods of manufacturing the semiconductor device are also proposed.

13 Claims, 3 Drawing Sheets

(56) References Cited

U.S. PATENT DOCUMENTS

| | | | | |
|---|---|---|---|---|
| 10,418,470 B2* | 9/2019 | Gejo | ................... | H01L 29/8613 |
| 10,727,225 B2* | 7/2020 | Gejo | ................... | H01L 29/0615 |
| 10,763,252 B2* | 9/2020 | Yamano | .............. | H01L 29/0638 |
| 11,276,773 B2* | 3/2022 | Soneda | ............... | H01L 29/0607 |
| 2015/0155277 A1* | 6/2015 | Ogura | ................ | H01L 29/7397 |
| | | | | 257/140 |
| 2016/0181391 A1* | 6/2016 | Bobde | ............... | H01L 29/66136 |
| | | | | 438/270 |
| 2016/0351561 A1* | 12/2016 | Senoo | ................ | H01L 29/4238 |
| 2016/0351562 A1* | 12/2016 | Senoo | ................ | H01L 29/0696 |
| 2017/0025408 A1* | 1/2017 | Schulze | ................. | H01L 29/47 |
| 2017/0025410 A1* | 1/2017 | Cheng | ................ | H01L 29/0834 |
| 2017/0047322 A1* | 2/2017 | Yoshida | ............... | H01L 29/417 |
| 2018/0308839 A1* | 10/2018 | Takahashi | ........... | H01L 29/4238 |
| 2019/0181136 A1* | 6/2019 | Niwa | ............... | H01L 27/0664 |
| 2019/0228973 A1* | 7/2019 | Kimura | .............. | H01L 29/1095 |
| 2021/0265491 A1* | 8/2021 | Son | ...................... | H01L 29/407 |
| 2022/0037514 A1* | 2/2022 | Harada | .............. | H01L 29/0619 |

\* cited by examiner

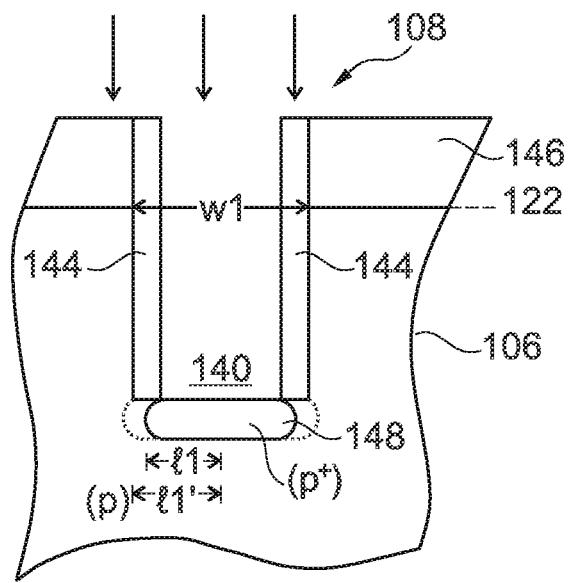
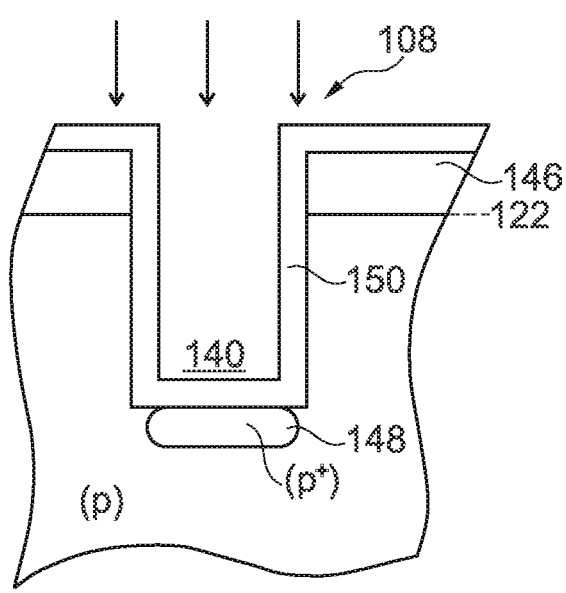
Fig. 3A  Fig. 3B
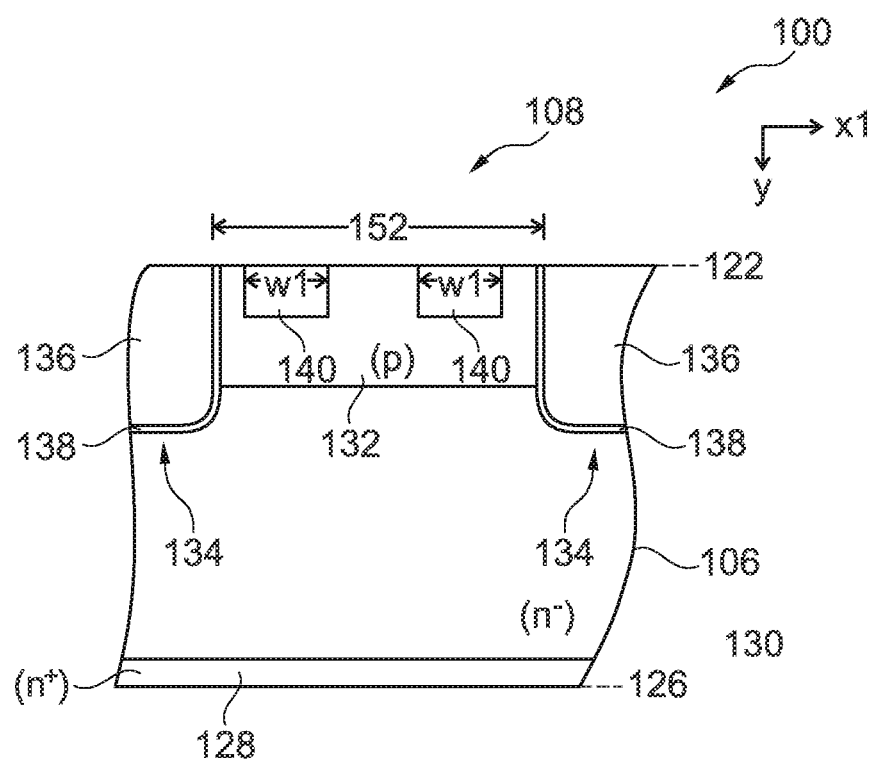
Fig. 4A

SEMICONDUCTOR DEVICE INCLUDING AN ANODE CONTACT REGION HAVING A VARIED DOPING CONCENTRATION

TECHNICAL FIELD

The present disclosure is related to semiconductor devices, in particular to semiconductor devices including an insulated gate bipolar transistor (IGBT) and manufacturing methods therefore.

BACKGROUND

Technology development of semiconductor devices, e.g. IGBTs or insulated gate field effect transistors (IGFETs), aims at improving electric device characteristics. Although one semiconductor device characteristic may be improved by varying a certain device parameter, this may lead to deterioration of another device characteristic. As an example, the area-specific on-state resistance $R_{DS(on)}$ may be improved by, for instance, increasing a drift zone doping concentration, which may, however, lead to deterioration of the blocking voltage capability Vas between source and drain. As another example, improving a reverse conducting, RC-diode in an RC-IGBT may adversely affect a contact resistance and a commutation ruggedness, for example. Thus, device parameters are designed during technology development based on a number of tradeoffs to be met in view of target device specifications.

There is a need to improve semiconductor devices including IGBTs.

SUMMARY

An example of the present disclosure relates to a semiconductor device. The semiconductor device includes an IGBT in an IGBT portion of a semiconductor body. The semiconductor device further includes a diode in a diode portion of the semiconductor body. The diode includes an anode region of a first conductivity type. The anode region is confined by diode trenches along a first lateral direction. Each of the diode trenches includes a diode trench electrode and a diode trench dielectric. The diode further includes a first contact groove extending into the anode region along a vertical direction from a first surface of the semiconductor body. The diode further includes an anode contact region of the first conductivity type adjoining a bottom side of the first contact groove. The diode further includes a cathode contact region of a second conductivity type adjoining a second surface of the semiconductor body opposite to the first surface.

Another example of the present disclosure relates to a method of manufacturing a semiconductor device. The method includes forming an IGBT in an IGBT portion of a semiconductor body. The method further includes forming a diode in a diode portion of the semiconductor body. Forming the diode includes forming an anode region of a first conductivity type, wherein the anode region is confined by diode trenches along a first lateral direction. Each of the diode trenches includes a diode trench electrode and a diode trench dielectric. Forming the diode further includes forming a first contact groove extending into the anode region along a vertical direction from a first surface of the semiconductor body. Forming the diode further includes forming an anode contact region of the first conductivity type adjoining a bottom side of the first contact groove. Forming the diode further includes forming a cathode contact region of a second conductivity type adjoining a second surface of the semiconductor body opposite to the first surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of semiconductor devices and methods of manufacturing semiconductor devices and together with the description serve to explain principles of the examples. Further examples are described in the following detailed description and the claims.

FIGS. 3A and 3B are schematic cross-sectional views for illustrating process features when manufacturing the semiconductor device of FIG. 1.

FIGS. 4A and 4B are schematic cross-sectional views for illustrating examples of contact grooves in the diode and the IGBT of FIG. 1.

DETAILED DESCRIPTION

Figure 1:
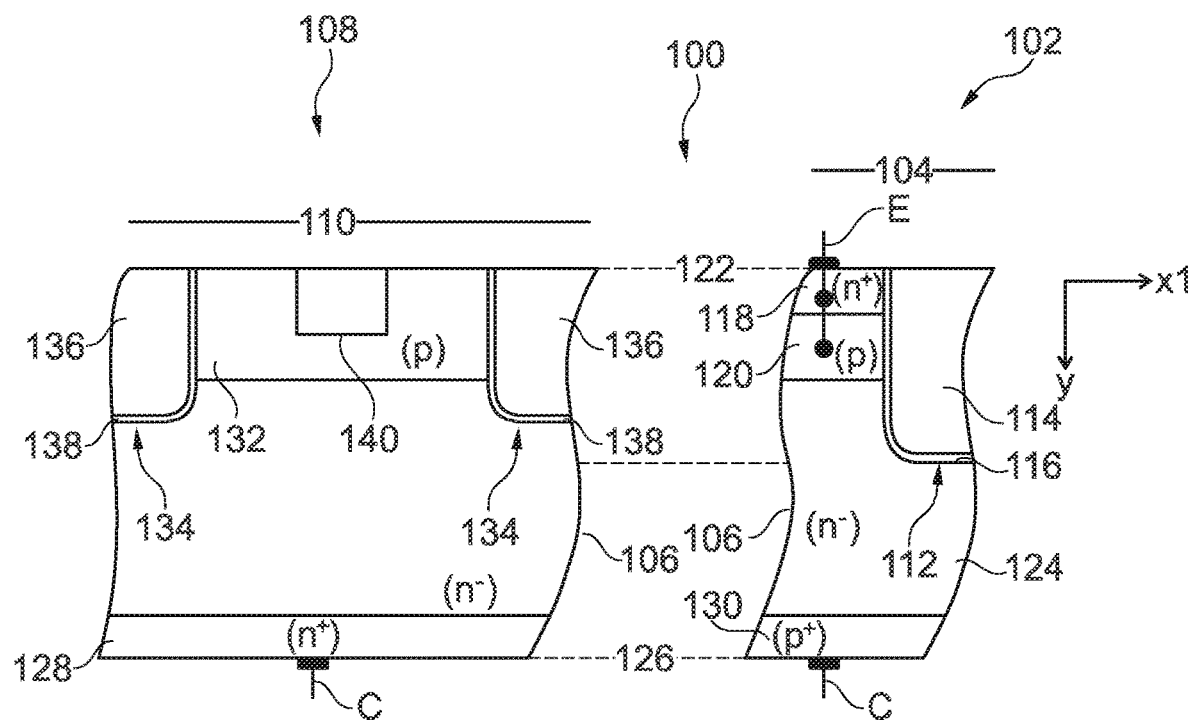
FIG. 1 is a schematic cross-sectional view for illustrating a semiconductor device including an IGBT and a diode.

In the following detailed description, reference is made to the accompanying drawings, which form a part hereof and in which are shown by way of illustrations specific examples in which semiconductor devices and methods of manufacturing a semiconductor device may be practiced. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state.

An ohmic contact is a non-rectifying electrical junction with a linear or almost linear current-voltage characteristic. If two components (e.g., two regions) form an ohmic contact or a Schottky contact, respectively, this may mean that an ohmic contact or a Schottky contact is present between said two components. In both cases, it may be possible for said two regions to directly adjoin each other. However, it may also be possible that a further component is positioned between said two components.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a semiconductor may include an IGBT in an IGBT portion of a semiconductor body. The semiconductor device may further include a diode in a diode portion of the semiconductor body.

The diode may include an anode region of a first conductivity type. The anode region may be confined by diode trenches along a first lateral direction. Each of the diode trenches may include a diode trench electrode and a diode trench dielectric. The diode may further include a first contact groove extending into the anode region along a vertical direction from a first surface of the semiconductor body. The diode may further include an anode contact region of the first conductivity type adjoining a bottom side of the first contact groove. The diode may further include a cathode contact region of a second conductivity type adjoining a second surface of the semiconductor body opposite to the first surface.

For example, the IGBT may include a collector region of the first conductivity type adjoining the second surface. The semiconductor device may further include a collector electrode directly electrically connected to the cathode contact region in the diode region and to the collector region in the IGBT portion via the second surface.

For example, the IGBT may further include a gate trench including a gate electrode and a gate dielectric. The IGBT may further include a source region of the second conductivity type adjoining the gate trench. The IGBT may further include a body region of the first conductivity type adjoining the gate trench. The IGBT may further include an emitter electrode electrically connected to the body region and to the source region via the first surface of the semiconductor body. The IGBT may further include a drift region of the second conductivity type between the body region and the second surface of the semiconductor body.

For example, the IGBT may be a vertical power semiconductor device. The vertical power semiconductor device may be configured to conduct currents of more than 1 A or more than 10 A or even more than 30 A and may be further configured to block voltages between load terminals, e.g. between the emitter electrode and the collector electrode of the IGBT in the range of several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

The gate electrode may include or consist of a heavily doped polycrystalline silicon layer and/or a metal-containing layer. The gate electrode may be electrically connected to a gate metallization. The gate metallization may form or may be electrically connected or coupled to a gate terminal. The gate dielectric may be formed between the gate electrode and the semiconductor body. The gate dielectric may include or consist of thermally grown or deposited silicon oxide, silicon nitride, silicon oxynitride, another deposited dielectric material or any combination thereof. A thickness of the gate dielectric may be selected to obtain transistor cells having a threshold voltage in a range from 1.0 V to 8 V, for example. The gate trench may exclusively include the gate electrode and the gate dielectric or may include further conductive and/or dielectric structures in addition to the gate electrode and the gate dielectric. The gate electrode and any optional additional auxiliary electrode may include or consist of an electrode material or a combination of electrode materials, for example a doped semiconductor material (e.g., a degenerate doped semiconductor material) such as doped polycrystalline silicon, metal or metal compound, for example.

The emitter electrode may be part of a wiring area above the first main surface. The wiring area may include one, two, three or even more wiring levels that may include patterned metal layers and interlayer dielectrics arranged between the patterned metal layers. Vias may electrically interconnect the different wiring levels, for example. For example, the emitter electrode may be formed as part of the first wiring level and may be electrically connected to the source and body regions by contact plugs extending through an interlayer dielectric arranged between the semiconductor body and the first wiring level, for example.

For example, the transistor cells of the IGBT may be formed as stripes extending in parallel along a second lateral direction. The second lateral direction may be a lateral direction that is perpendicular to the first lateral direction, for example. For example, the source and body regions may be formed in mesa regions. The mesa regions may extend as stripes along the second lateral direction. Along the first lateral direction, each mesa region may be confined by trenches. For example, the source region may be arranged as a plurality of source sub-regions along the second lateral direction, wherein the plurality of source sub-regions are spaced from one another by a lateral distance.

For example, in at least one of the mesa regions of a transistor cell area of the IGBT, the source region may adjoin only one of opposite trenches confining the respective mesa region. In this case, the source region may adjoin one of the gate trenches at a first side, wherein the mesa region may adjoin another type of trench at an opposite second side, for example. The other type of trench may also include a trench electrode and a trench dielectric. For example, materials and dimensions of the trench electrode and the trench dielectric of the other trench and the gate trench may be equal. However, the trench electrode in the other type of trench may be electrically connected to an electrode different from a gate terminal. For example, the trench electrode in the other type of trench may be electrically connected to the emitter electrode. In this case, the other type of trench may be also called a source trench. Along sidewalls of the source trench, load current flow may be suppressed in view of the omitted gate electrode in the source trench and in view of the missing source region, for example. For example, some of the mesa regions in the transistor cell area of the IGBT may be confined by opposite source trenches, for example. Some other mesa regions in the transistor cell area of the IGBT may be confined by opposite gate trenches. For example, yet some other mesa regions in the transistor cell area of the IGBT may be confined by a source trench at one of opposite first and second sides, and by a gate trench at the other one of the opposite first and second sides, for example. Adjusting the number and dimensions of e.g. source and gate trenches and source regions may allow for tuning electric parameters of the IGBT, for example.

A vertical extent and a doping concentration of the drift region may be parameters for adjusting a target electric breakdown voltage between the emitter and collector electrode, for example.

The collector electrode may include or consist of a heavily doped polycrystalline silicon layer and/or a metal-containing layer.

For example, in the mesa regions of the diode adjacent the IGBT, source regions, which are electrically connected to the emitter electrode, may be omitted, for example. For example, opposite sidewalls of the anode region may directly adjoin the of the trench dielectrics, e.g. including a part of the sidewall that adjoins the first surface. For example, materials and dimensions of electrodes and dielectrics in the gate trench and in the diode trench may be equal, for example.

For example, the diode trench electrode may be electrically connected to a terminal different from the gate terminal. For example, the diode trench electrode may be electrically connected to the emitter electrode. For example, a number of diode trenches subsequently arranged along a lateral direction, e.g. the first lateral direction, may be larger than 30, or larger than 100, or even larger than 300. For example, an extension of diode trenches subsequently arranged along a lateral direction, e.g. the first lateral direction, may be larger than 3 µm, or larger than 50 µm, or larger than 200 µm, or even larger than 900 µm along this lateral direction.

For example, a dimension of one or more mesa regions of the diode may be larger than a dimension of some or all of the mesa regions of the IGBT, for example.

For example, one or more of the mesa regions of the diode may include at least two first contact grooves separated from one another along the first lateral direction between opposite diode trenches, for example. For example, a width or lateral extent of one, some or all of the first contact grooves of the diode along the first lateral direction may differ from a width or lateral extent of a second contact groove in the IGBT transistor cell area. For example, a width or lateral extent of at least one of the first contact grooves may be larger than a width or lateral extent of the mesa region in the transistor cell area of the IGBT, for example.

For example, the IGBT and the diode may be at least partly laterally surrounded by an edge termination area.

Edge termination elements may be formed in the edge termination area, which is an area of the semiconductor body that partly or fully surrounds the active device area. Since pn junctions within the semiconductor body, e.g. pn junctions between a body region and the drift region of the IGBT or between the cathode region and the anode region of the diode, are not infinite, but terminate at the edge zones of the semiconductor body, this edge effect limits the device breakdown voltage below the ideal value that is set by the infinite parallel plane junction. Care must be taken to ensure proper and efficient termination of the pn junction at the edge of the semiconductor body. The edge termination area is a measure for ensuring proper and efficient termination of the pn junction. In the edge termination area, the edge termination structures may be formed for lowering the electric field at the edge of the semiconductor body. Depending on the voltage class of the semiconductor device, a lateral dimension of the edge termination area may vary. Semiconductor devices with higher voltage classes typically require larger lateral extensions of their edge termination areas for ensuring proper termination of the pn junction. Examples of edge termination structures in the edge termination area include field plates, junction termination extension (JTE) structures, variation of lateral doping (VLD) structures, for example. There may be a transition region between the active device area and the edge termination area for electrically connecting the edge termination structure, for example.

For example, the anode contact region may have a higher doping concentration than the anode region at a reference depth, e.g. reference distance to the first surface of the semiconductor body. The anode contact region may support a low-ohmic connection between the anode region and the first contact groove, for example. The anode contact region may be formed by at least one ion implantation process through a bottom side of the first contact groove. By shielding sidewalls of the first contact groove during the at least one ion implantation process, e.g. by a spacer or liner, doping of the semiconductor body at the sidewalls of the first contact groove may be reduced or suppressed, for example. Doping at the sidewalls may be caused by back-scattered dopant ions, e.g. from the groove bottom. Since an anode efficiency of the diode may depend on sidewall doping, process variations of e.g. groove taper, implant angle or groove dimensions may cause undesired variations in the anode efficiency. A sidewall spacer during ion implantation may allow for a reduction of sidewall doping, thereby enabling more precise setting of the anode efficiency of the diode. A maximum doping concentration in a sidewall doping region may be smaller than a maximum doping concentration of the anode contact region by at least a factor 100, or 1000, or 10000, for example.

For example, the anode contact region may have a first doping concentration at a first position below a center or middle of a bottom side of the first contact groove. The doping concentration of the anode contact region may decrease by at least a factor of ten over a lateral distance $l1$ starting from the first position to a second position along the first lateral direction. The lateral distance $l1$ may be smaller than half of a width of the first contact groove along the first lateral direction at the first surface. The above lateral distance $l1$ of the first doping concentration is smaller than a lateral distance $l1'$ of an anode contact region implanted through a bottom side of the first contact groove without any spacer at the sidewalls of the groove. Formation of the anode contact region by ion implantation using sidewall spacers not only allows for reducing undesired sidewall doping but also allows for a reduction of the lateral extent of the anode contact region. Thus, lateral protrusion of the anode contact region from the bottom side of the first contact groove may be controlled. For example, the doping concentration of the anode contact region may also decrease by at least a factor of 50, or by at least a factor of 100, or by at least a factor of 500 over the lateral distance 11.

For example, a doping concentration profile of the anode contact region may be a diffusion broadened profile of dopants introduced into the semiconductor body through a bottom side of the first contact groove by ion implantation, wherein a sidewall spacer is arranged at sidewalls of the first contact groove at the time of the ion implantation. For example, a thickness of the sidewall spacer may range from 5 nm to 100 nm, or from 10 nm to 50 nm, for example. Use of a sidewall spacer for forming the body contact region will result in an overall smaller lateral extent of diffusion broadened profile the implanted dopants compared with an implant without any sidewall spacers. For example, a vertical and lateral diffusion broadened profile of the dopants introduced into the semiconductor body through a bottom side of the first contact groove by ion implantation may be determined by an appropriate characterization technique, e.g. Secondary Ion Mass Spectrometry (SIMS), Spreading Resistance Analysis (SRA), Stripping Hall (SH) or Electrochemical Capacitance Voltage (ECV) measurements. Since the vertical profile and the lateral profile are interrelated, semiconductor process simulation, e.g. technology computer aided design (TCAD) tools allow to determine a spacer thickness by fitting diffusion profiles to the experimental data of the lateral and vertical profile depending on the spacer thickness for forming the anode contact region. In this way, proof of use of a sidewall spacer for formation of the anode contact region can be furnished. As an alternative or in addition to a spacer, a liner may be used, wherein the liner lines sidewalls and a bottom side of the first contact groove and the dopants are implanted through the liner into the semiconductor body, for example.

For example, the semiconductor device may further comprise a second contact groove extending into the body region along the vertical direction from the first surface. For example, the first contact groove in the diode and the second contact groove in the IGBT may be concurrently formed. For example, filling material(s) of the first contact groove and the second contact groove may be equal.

For example, the semiconductor device may further comprise a body contact region of the first conductivity type adjoining a bottom side of the second contact groove. A doping concentration profile of the anode contact region along the vertical direction at a center of the first contact groove may be equal to a doping concentration profile of the body contact region along the vertical direction at a center of the second contact groove. The doping concentration profiles of the body contact and the anode contact region may be concurrently formed, for example.

For example, a width of the second contact groove at the first surface may be equal to a width of the first contact groove at the first surface, and a depth of the second contact groove may be equal to a depth of the first contact groove.

For example, the IGBT may include an array of IGBT transistor cells. The diode may be arranged outside of the array of IGBT transistor cells. For example, the IGBT transistor cells may be in the form of stripes. The diode may also be formed in the form of stripes. For example, mesa regions of the IGBT transistor cells at a first surface part of the body may turn into mesa regions of the diode at a second surface part of the semiconductor body, for example. In addition or as an alternative, mesa regions of the diode may also be arranged in a third surface part of the semiconductor body, wherein the mesa regions of the diode and the mesa regions of the IGBT extend in parallel to each other, for example.

For example, a lateral extent of the diode may be larger than a thickness of the semiconductor body. For example, the lateral extent of the diode that is larger than the thickness of the semiconductor body may be a first lateral extent along a lateral reference direction that is smaller than a second lateral extent along a lateral direction perpendicular to the lateral reference direction. For example, the lateral extent may be a minimum lateral extent of the diode, for example.

For example, the diode trench electrode may be electrically connected to the emitter electrode.

Details on structural elements of the semiconductor device, e.g. processes of manufacturing, dimensions or functions of structural elements of the IGBT or the diode described in the examples above correspondingly apply to the features described with reference to the methods and figures below.

A method of manufacturing a semiconductor device may include forming an IGBT in an IGBT portion of a semiconductor body. The method may further include forming a diode in a diode portion of the semiconductor body. Forming the diode may include forming an anode region of a first conductivity type, wherein the anode region is confined by diode trenches along a first lateral direction. Each of the diode trenches may include a diode trench electrode and a diode trench dielectric. Forming the diode may further include forming a first contact groove extending into the anode region along a vertical direction from a first surface of the semiconductor body. Forming the diode may further include forming an anode contact region of the first conductivity type adjoining a bottom side of the first contact groove. Forming the diode may further include forming a cathode contact region of a second conductivity type adjoining a second surface of the semiconductor body opposite to the first surface.

The first contact groove may be formed by etching a groove into the semiconductor body. For example, the first contact groove may turn into a first contact hole in an interlayer dielectric on the semiconductor body. The first contact hole and the first contact groove may be filled with at least one conductive material, e.g. highly doped semiconductor material, metal, metal alloy or any combination thereof. One or more liner materials may line the first contact groove, e.g. for achieving improved adhesion and/or diffusion barrier properties.

For example, forming the IGBT may further include forming a collector region of the first conductivity type adjoining the second surface. The method may further include forming a collector electrode directly electrically connected to the cathode contact region in the diode region and to the collector region in the IGBT region via the second surface.

For example, the method may further comprise forming a spacer in the first contact groove. Thereafter, an anode contact region may be formed by introducing dopants into the semiconductor body through a bottom of the first contact groove as described in the examples above, for example.

For example, the method may further comprise forming a liner lining sidewalls and a bottom of the first contact groove. Thereafter, an anode contact region by introducing dopants into the semiconductor body through the liner at the bottom of the first contact groove as described in the examples above, for example.

For example, forming the IGBT in the IGBT portion may include forming an array of IGBT transistor cells, and wherein the diode in the diode portion is formed outside of the array of IGBT transistor cells.

For example, the method may further comprise forming a second contact groove extending into the body region along the vertical direction from the first surface.

For example, forming the IGBT may further include forming a gate trench including a gate electrode and a gate dielectric. Forming the IGBT may further include forming a source region of the second conductivity type adjoining the gate trench. Forming the IGBT may further include forming a body region of a first conductivity type adjoining the gate trench. Forming the IGBT may further include forming an emitter electrode electrically connected to the body region and to the source region via the first surface of the semiconductor body. Forming the IGBT may further include forming a drift region of the second conductivity type between the body region and the second surface of the semiconductor body.

For example, the method may further include forming a body contact region of the first conductivity type adjoining a bottom side of the second contact groove. The body contact region and the anode contact region may be formed concurrently.

For example, the body region and the anode region may also be formed concurrently.

The examples and features described above and below may be combined.

More details and aspects are mentioned in connection with the examples described above or below. Processing the semiconductor body may comprise one or more optional additional features corresponding to one or more aspects mentioned in connection with the proposed concept or one or more examples described above or below.

Functional and structural details described with respect to the examples above shall likewise apply to the exemplary examples illustrated in the figures and described further below.

Referring to the schematic cross-sectional view of FIG. 1, an example of a semiconductor device 100 is illustrated.

The semiconductor device 100 includes an IGBT 102 in an IGBT portion 104 of a semiconductor body 106. A gate trench 112 extends into the semiconductor body 106 along a vertical direction y from a first surface 122. The gate trench 112 includes a gate electrode 114 and a gate dielectric 116.

An n$^+$-doped source region 118 adjoins the gate trench 112. Also, a p-doped body region 120 adjoins the gate trench 112.

An emitter electrode E is electrically connected to the body region 120 and to the source region 118 via the first surface 122 of the semiconductor body 106. An n$^-$-doped drift region 124 is arranged between the body region 120 and a second surface 126 of the semiconductor body 106. A p$^+$-doped collector region 130, e.g. a rear side emitter region is arranged between the drift region 124 and the second surface 126. A collector electrode C is electrically connected to the collector region 130 via the second surface 126.

The semiconductor device further includes a diode 108 in a diode portion 110 adjacent the IGBT 102 in the IGBT portion 104. The diode 108 includes a p-doped anode region 132. The anode region 132 is confined by diode trenches 134 along a first lateral direction x1. Each of the diode trenches 134 includes a diode trench electrode 136 and a diode trench dielectric 138. A first contact groove 140 extends into the anode region 132 along a vertical direction y from the first surface 122 of the semiconductor body 106. An n$^+$-doped cathode contact region 128 is arranged between the anode region 132 and the second surface 126. The collector electrode C is electrically connected to the cathode contact region 128 via the second surface 126.

Details described in the examples above, e.g. details with respect to dimensions, processing or function correspondingly apply to the elements illustrated in the figures, e.g. FIG. 1.

Figures 2A, 2B:
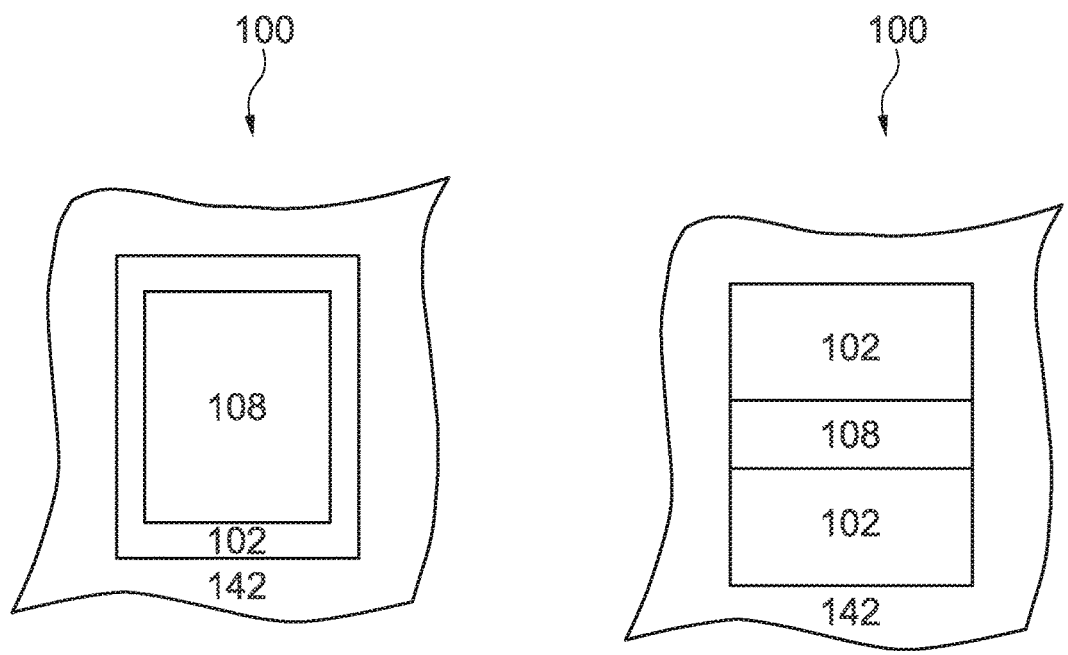
FIGS. 2A and 2B are schematic top views for illustrating exemplary arrangements of the IGBT and the diode of the semiconductor device of FIG. 1.

FIGS. 2A and 2B are schematic top views for illustrating exemplary arrangements of the diode 108 and the IGBT 102.

In the example illustrated in the top view of FIG. 2A the diode 108 laterally adjoins the IGBT 102 by being surrounded by the IGBT 102. An edge termination area 142 surrounds the IGBT 102 and the diode 108.

In the example illustrated in FIG. 2B, the diode 108 is arranged between separate parts of the IGBT 102. Apart from the exemplary arrangements of the diode 108 laterally adjoining the IGBT 102, a vast variety of other arrangements may be used, for example.

Referring to the schematic cross-section view of FIG. 3A, an example of a process feature when forming the semiconductor device 100 of FIGS. 1 to 2B is schematically illustrated. A spacer 144 is formed in the first contact groove 140. The spacer 144 also extends along sidewalls of an opening in an interlayer dielectric 146 on the first surface 122 of the semiconductor body 106. For example, the spacer 144 may include one or more dielectric materials, e.g. oxides and/or nitrides.

An anode contact region 148 is formed in the semiconductor body 106 by ion implantation of dopants through a bottom of the first contact groove 140. Details on the anode contact region 148, e.g. dimensions and benefits of the spacer process described in the examples above correspondingly apply. For example, the anode contact region 148 may have a first doping concentration at a first position below a center or middle of a bottom side of the first contact groove 140 having a first width w1 at the first surface 122. The doping concentration of the anode contact region 148 may decrease by at least by a factor of ten over a lateral distance l1 starting from the first position to a second position along the first lateral direction. The above lateral distance l1 of the first doping concentration is smaller than a corresponding lateral distance l1' of an anode contact region (indicated by a dotted line in FIG. 3A) implanted through a bottom side of the first contact groove without any spacer at the sidewalls of the groove.

Referring to the schematic cross-section view of FIG. 3B, another example of a process feature when forming the semiconductor device 100 of FIGS. 1 to 2B is schematically illustrated. A liner 150 is formed in the first contact groove 140. The liner 150 also extends along sidewalls of an opening in an interlayer dielectric 146 on the first surface 122 of the semiconductor body 106. For example, the liner 150 may include one or more dielectric materials, e.g. oxides and/or nitrides.

An anode contact region 148 is formed in the semiconductor body 106 by ion implantation of dopants through the liner 150 at the bottom of the first contact groove 140. Details on the anode contact region 148, e.g. dimensions and benefits of the liner process described in the examples above correspondingly apply.

Referring to the schematic cross-sectional view of FIG. 4A, in one or more mesa regions 152 of the diode 108 at least two first contact grooves 140 may be arranged and separated from one another along the first lateral direction x1 between opposite diode trenches 134. For example, a first width w1 of one, some or all of the first contact grooves 140 of the diode 108 along the first lateral direction x1 may differ from a second width or lateral extent of a second contact groove in the IGBT 102. The second contact groove in the IGBT 102 may be electrically connected to the source and body region, for example.

Figure 4B:
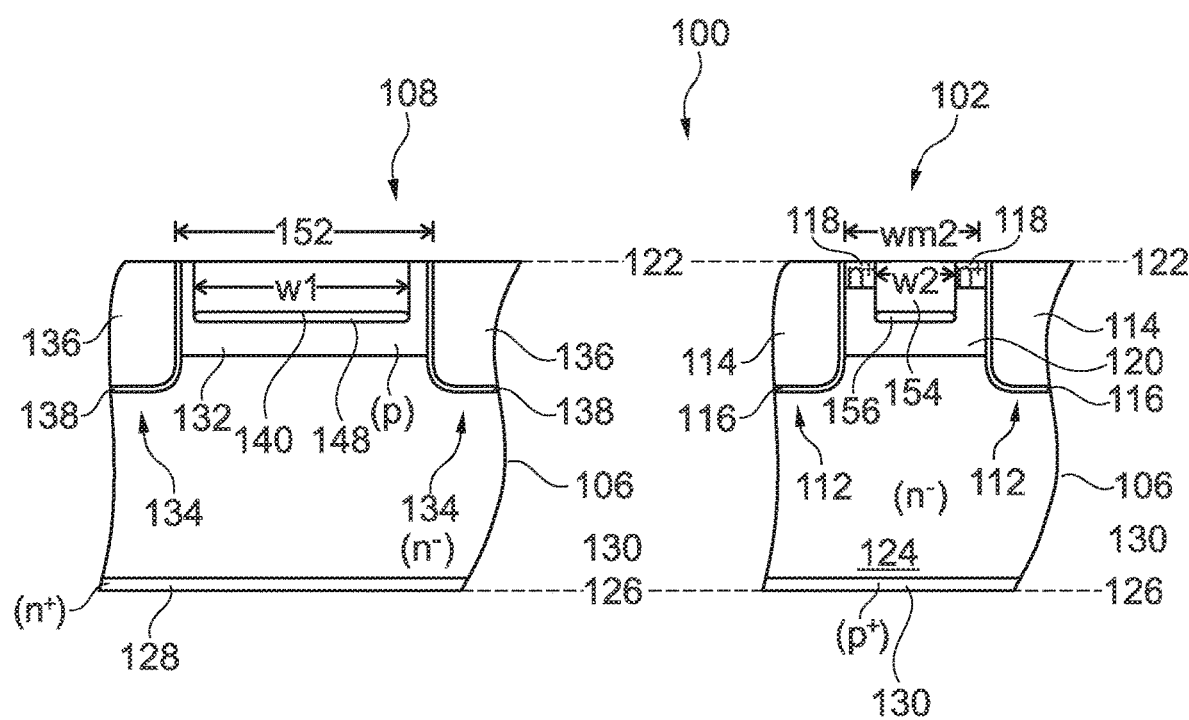

Referring to the schematic cross-sectional view of FIG. 4B, in one or more mesa regions 152 of the diode 108 the first width w1 of one, some or all of the first contact grooves 140 of the diode 108 along the first lateral direction x1 is larger than a width wm2 of a mesa region in the IGBT 102 and is further larger than a second width w2 of a second contact groove 154 of the IGBT 102. A body contact region 156 adjoins a bottom of the second contact groove 154. In other areas of the IGBT 102 and/or the diode 108, the first width w1 of the first contact groove 140 may be equal to the second width w2 of the second contact groove 154, for example.

The aspects and features mentioned and described together with one or more of the previously described examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof. The second conductivity type may be n-type and the first conductivity type may be p-type. As an alternative, the second conductivity type may be p-type and the first conductivity type may be n-type.

Although specific embodiments have been illustrated and de-scribed herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   an IGBT (insulated gate bipolar transistor) in an IGBT portion of a semiconductor body; and
   a diode in a diode portion of the semiconductor body, wherein the diode comprises:
      an anode region of a first conductivity type and confined by diode trenches along a first lateral direction, each of the diode trenches including a diode trench electrode and a diode trench dielectric;
      a first contact groove extending into the anode region along a vertical direction from a first surface of the semiconductor body;
      an anode contact region of the first conductivity type adjoining a bottom side of the first contact groove; and
      a cathode contact region of a second conductivity type adjoining a second surface of the semiconductor body opposite to the first surface,
   wherein the anode contact region has a first doping concentration at a first position below a center of a bottom side of the first contact groove, wherein the doping concentration of the anode contact region decreases by at least a factor of ten over a lateral distance starting from the first position to a second position along the first lateral direction.

2. The semiconductor device of claim 1, wherein the IGBT comprises a collector region of the first conductivity type adjoining the second surface, and wherein the semiconductor device further comprises a collector electrode directly electrically connected to the cathode contact region in the diode portion and to the collector region in the IGBT portion via the second surface.

3. The semiconductor device of claim 1, wherein the lateral distance is smaller than half of a width of the first contact groove along the first lateral direction at the first surface.

4. The semiconductor device of claim 3, wherein the doping concentration of the anode contact region decreases by at least a factor of 100 over the lateral distance.

5. The semiconductor device of claim 1, wherein a doping concentration profile of the anode contact region is a diffusion broadened profile of dopants introduced into the semiconductor body through a bottom side of the first contact groove by ion implantation, and wherein a sidewall spacer or liner is arranged at sidewalls of the first contact groove at the time of the ion implantation.

6. The semiconductor device of claim 1, wherein the IGBT comprises:
   a gate trench including a gate electrode and a gate dielectric;
   a source region of the second conductivity type adjoining the gate trench;
   a body region of the first conductivity type adjoining the gate trench;
   an emitter electrode electrically connected to the body region and to the source region via the first surface of the semiconductor body; and
   a drift region of the second conductivity type between the body region and the second surface of the semiconductor body.

7. The semiconductor device of claim 6, further comprising a second contact groove extending into the body region along the vertical direction from the first surface.

8. The semiconductor device of claim 7, further comprising a body contact region of the first conductivity type adjoining a bottom side of the second contact groove, wherein a doping concentration profile of the anode contact region along the vertical direction at a center of the first contact groove is equal to a doping concentration profile of the body contact region along the vertical direction at a center of the second contact groove.

9. The semiconductor device of claim 7, wherein a width of the second contact groove at the first surface is equal to a width of the first contact groove at the first surface, and wherein a depth of the second contact groove is equal to a depth of the first contact groove.

10. The semiconductor device of claim 1, wherein the IGBT includes an array of IGBT transistor cells, and wherein the diode is arranged outside the array of IGBT transistor cells.

11. The semiconductor device of claim 1, wherein a lateral extent of the diode is larger than a thickness of the semiconductor body.

12. The semiconductor device of claim 1, wherein the diode trench electrode is electrically connected to an emitter electrode of the IGBT.

13. The semiconductor device of claim 1, wherein at least two of the first contact grooves are separated from one another along the first lateral direction between the diode trenches confining the anode region of the first conductivity type.

\* \* \* \* \*

UNITED STATES PATENT AND TRADEMARK OFFICE
CERTIFICATE OF CORRECTION

PATENT NO. : 11,444,158 B2
APPLICATION NO. : 17/106413
DATED : September 13, 2022
INVENTOR(S) : C. Sandow et al.

It is certified that error appears in the above-identified patent and that said Letters Patent is hereby corrected as shown below:

On the Title Page

Page 2/item (56) U.S. Pat. Docs. (Line 15), please change "Son" to -- Soneda --.

Signed and Sealed this
Tenth Day of January, 2023

Katherine Kelly Vidal
*Director of the United States Patent and Trademark Office*